(12) United States Patent
Moore et al.

(10) Patent No.: US 10,760,949 B2
(45) Date of Patent: Sep. 1, 2020

(54) PIEZOELECTRIC PRESSURE WAVE ANALYSIS

(71) Applicant: ACERTARA ACOUSTIC LABORATORIES LLC, Longmont, CO (US)

(72) Inventors: Levi Moore, Longmont, CO (US); Nicholas Ellens, Longmont, CO (US); James Gessert, Longmont, CO (US)

(73) Assignee: Acertara Acoustic Laboratories, LLC, Longmont, CO (US)

( * ) Notice: Subject to any disclaimer, the term of this patent is extended or adjusted under 35 U.S.C. 154(b) by 0 days.

(21) Appl. No.: 16/128,243

(22) Filed: Sep. 11, 2018

(65) Prior Publication Data

US 2020/0080888 A1     Mar. 12, 2020

(51) Int. Cl.
| | | |
|---|---|---|
| *G01H 11/08* | (2006.01) | |
| *H01L 41/047* | (2006.01) | |
| *H01L 41/113* | (2006.01) | |
| *H05K 1/11* | (2006.01) | |
| *H05K 1/14* | (2006.01) | |
| *H01L 41/311* | (2013.01) | |
| *H01L 41/04* | (2006.01) | |
| *H01L 41/193* | (2006.01) | |

(52) U.S. Cl.
CPC ........... *G01H 11/08* (2013.01); *H01L 41/042* (2013.01); *H01L 41/047* (2013.01); *H01L 41/1132* (2013.01); *H01L 41/193* (2013.01); *H01L 41/311* (2013.01); *H05K 1/115* (2013.01); *H05K 1/147* (2013.01); *H05K 2201/041* (2013.01); *H05K 2201/09609* (2013.01); *H05K 2201/10083* (2013.01); *H05K 2201/10151* (2013.01)

(58) Field of Classification Search
CPC ..... G01H 11/08; H01L 41/042; H01L 41/047; H01L 41/1132; H01L 41/193; H01L 41/311; H05K 1/147; H05K 2201/041; H05K 2201/0969; H05K 2201/10083; H05K 2201/10151; H05K 1/115
USPC .......................................................... 73/658
See application file for complete search history.

(56) References Cited

U.S. PATENT DOCUMENTS 4,633,123 A * 12/1986 Radice ............... H03K 17/9643
                                                  310/339
4,651,567 A    3/1987 Sandhu
(Continued)

*Primary Examiner* — Peter J Macchiarolo
*Assistant Examiner* — Monica S Young
(74) *Attorney, Agent, or Firm* — Holzer Patel Drennan

(57) ABSTRACT

Appliances, methods, and systems (e.g., utilities) for use in analyzing received pressure waves to obtain and deduce various types of meaningful information therefrom (e.g., testing operation of an acoustic device that generates beams of acoustic energy). A pressure sensor in the disclosed system makes use of a piezoelectric layer or film (e.g., polyvinylidene fluoride (PVDF)) that has been substantially uniformly poled prior to interconnection with electrodes that are configured to send electrical signals to a controller or the like for generation of a dynamic, image (e.g., 2D) representing the received pressure waves. Among other advantages, the disclosed system leverages excellent economy of scale, can be configured in different arrangements with reduced cost, and limits the need for adapters or reverse engineering (e.g., as it can operate independently of the design of a probe or system under test.

16 Claims, 5 Drawing Sheets

(56) References Cited

U.S. PATENT DOCUMENTS

| | | | |
|---|---|---|---|
| 4,722,346 A | | 2/1988 | Chen |
| 4,936,138 A | | 6/1990 | Cushman |
| 5,543,591 A | * | 8/1996 | Gillespie ................. G06F 3/038 |
| | | | 178/18.03 |
| 5,889,236 A | * | 3/1999 | Gillespie ................. G06F 3/041 |
| | | | 178/18.01 |
| 6,035,696 A | | 3/2000 | Kiefer |
| 6,122,968 A | | 9/2000 | Vandervalk |
| 6,552,841 B1 | | 4/2003 | Lasser |
| RE40,456 E | * | 8/2008 | Bates ................. G01S 15/8915 |
| | | | 367/103 |
| 8,893,541 B2 | | 11/2014 | Gessert |
| 2003/0158479 A1 | | 8/2003 | Li |
| 2005/0156362 A1 | * | 7/2005 | Arnold ................. C04B 41/009 |
| | | | 264/618 |
| 2007/0038096 A1 | | 2/2007 | Seip |
| 2010/0253552 A1 | * | 10/2010 | Lanceros Mendez .. G06F 3/023 |
| | | | 341/22 |
| 2012/0165665 A1 | | 6/2012 | Sandstrom |
| 2012/0184849 A1 | | 7/2012 | Sandstrom |
| 2012/0200506 A1 | * | 8/2012 | Taylor .................... G06F 3/041 |
| | | | 345/173 |
| 2014/0020469 A1 | * | 1/2014 | Gessert ................. G10K 1/341 |
| | | | 73/618 |
| 2016/0360613 A1 | * | 12/2016 | Kho ..................... H05K 1/0286 |
| 2017/0080255 A1 | * | 3/2017 | Law ........................ A61N 7/00 |
| 2018/0143716 A1 | * | 5/2018 | Choi ..................... G06F 3/0414 |
| 2018/0154394 A1 | * | 6/2018 | Haque ................. G01S 7/52046 |
| 2019/0027675 A1 | * | 1/2019 | Choi ................... G01S 7/52079 |
| 2019/0192384 A1 | * | 6/2019 | Wong ........................ A61J 7/02 |
| 2019/0316958 A1 | * | 10/2019 | Akkaraju ................ G01S 15/02 |

* cited by examiner

PIEZOELECTRIC PRESSURE WAVE ANALYSIS

FIELD OF THE INVENTION

This application generally relates to sensors for use in detecting and analyzing pressure waves.

BACKGROUND OF THE INVENTION

Transmission of pressure waves such as acoustic radiation towards a target and receipt of the scattered radiation may be managed by a modern acoustic-imaging system, which may take a variety of forms. For instance, acoustic imaging is an important technique that may be used at different acoustic frequencies for varied applications that range from medical imaging to nondestructive testing of structures. The techniques generally rely on the fact that different structures have different acoustic impedances, allowing characterization of structures and their interfaces from information embodied by the different scattering patterns that result. While most applications use radiation reflected from structures, some techniques also make use of information in transmitted patterns.

For example, many modern systems are based on multiple-element array transducers that may have linear, curved-linear, phased-array or similar characteristics, and which may be embodied in an acoustic probe. Summing the contributions of the multiple transducer elements comprised by a transducer array allows images to be formed.

It is sometimes desired to analyze certain portions of received pressure waves relative to other portions of pressure waves. In the case of ultrasound probes, for instance, the failure of a small number of elements in a given array, or a few defective receive channels in the acoustic system itself, may not be readily perceptible to users because of the averaging effect of summing many elements to form an acoustic beam. But the failure of even a small number of elements or receive channels can significantly degrade the performance of acoustic imaging systems, notably in certain modes of operation like those known as "Doppler" or "near-field" imaging modes.

Thus, appliances have previously been developed to analyze received acoustic waves to determine whether certain portions of the waves indicate that particular corresponding transducer elements (e.g., that generated such certain portions of the waves) are defective. However, such existing appliances are relatively complex, based on the direct electrical connection to probe elements or system channels. The development of two-dimensional "matrix array" probe technology has made the necessary reverse engineering of even a small number of probe and system models to support direct electrical-connection-based testing complex and expensive. Other solutions use a sensor to detect energy emanating from a probe and to inject signals back into the ultrasound system for detection and display. Such solutions use a single sensor designed to sense elements in linear arrays, providing only a "signal" or "no signal" status relative to transmitted energy and require operator skill to scan a linear array probe for missing or nonfunctional elements.

There is thus a need in the art for convenient, inexpensive, and easy-to-use methods and appliances (e.g., sensors) for evaluating pressure waves in various contexts such as ultrasonic probes and systems, both for acoustic power output as well as for other issues such as failed elements or channels, particularly to evaluate two-dimensional array probes and systems.

SUMMARY

Disclosed herein is a system for receiving and analyzing various types of pressure waves (e.g., through any appropriate medium such as gas, liquid, or solid) to identify differences in portions of the waves relative to other portions of the waves. In one embodiment, the disclosed system includes a pressure sensor that receives pressure waves and a controller that generates one or more corresponding images or the like on a display to allow users to identify such differences in portions of the waves relative to other portions of the waves For instance, the disclosed system may be used to test operation of an acoustic device by way of receiving acoustic energy and generating images on a display to allow users to readily identify missing or defective transducer elements or regions in the acoustic device based on gaps or changes in the energy distribution in the image relative to other portions of the image. The disclosed sensor makes use of a piezoelectric layer or film (e.g., polyvinylidene fluoride (PVDF)) that has been substantially uniformly poled in the thickness direction prior to interconnection with electrodes configured to send electrical signals to a controller or the like for generation of a dynamic, image (e.g., 2D) representing the pressure waves in a plane perpendicular to direction of the incoming pressure waves. Among other advantages, the disclosed system limits the need for adapters or reverse engineering, leverages excellent economy of scale, and can be configured in different arrangements with reduced cost.

In one aspect, a system for analyzing pressure waves is disclosed (e.g., as one example, testing operation of an acoustic device that generates beams of acoustic energy). The system includes an pressure sensor (e.g., imaging array) for generating electrical signals in response to impinging receipt of pressure waves (e.g., acoustic energy generated by an acoustic device), and a controller electrically coupled with individually-addressable sensors of the pressure sensor and having instructions to generate an image on a display based on the generated electrical signals received from the pressure sensor (e.g., where the image provides a representation of the generated beam of pressure waves for use in, for instance, identifying missing or defective transducer elements or regions in the acoustic device). Specifically, the pressure sensor includes a first printed circuit board (PCB) that includes a plurality of rows of electrodes surrounded by ground for isolation, a second PCB that includes a plurality of columns of electrodes surrounded by ground for isolation, and a piezoelectric layer disposed between the first and second PCBs. Each electrode of each row of electrodes of the first PCB is aligned with an electrode of a different one of the plurality of columns of electrodes of the second PCB, and each respective pair of aligned electrodes is one of the individually-addressable sensors of the pressure sensor. For instance, generated electrical signals received by way of a particular one of the rows of electrodes and a particular one of the columns electrodes may correspond to a particular portion of the beam of pressure waves.

In another aspect, a system for analyzing pressure waves is disclosed. The system includes a pressure sensor for generating electrical signals in response to impinging receipt of pressure waves, a controller, and a flexible printed circuit (FPC) connector electrically connected between the controller and pads of the PCB and including instructions to generate an image on a display based on the generated electrical signals received from the pressure sensor. The pressure sensor includes a ground plane; a printed circuit board (PCB) that includes a plurality of rows of electrodes surrounded by ground for isolation, each electrode of the plurality of rows of electrodes being electrically connected to a respective electrical pad by a respective electrical trace; and a piezoelectric layer disposed between ground plane and the PCB, each electrode of the plurality of rows of electrodes being a respective individually-addressable sensor.

In a further aspect, a method for analyzing pressure waves (e.g., for use in testing operation of an acoustic device that generates beams of acoustic energy) includes receiving, at a piezoelectric layer of a pressure sensor, a beam of pressure waves (e.g., acoustic energy generated by an acoustic device); deforming the piezoelectric layer with the received beam of pressure waves; generating, by the piezoelectric layer, electrical signals in response to the deforming; sending the generated electrical signals through a grid of electrically conductive vias of at least one printed circuit board (PCB) of the pressure sensor to a controller; and generating, by the controller, an image on a display from the generated electrical signals, the image providing a representation of the received beam of pressure waves.

In yet another aspect, a method of fabricating a pressure sensor includes providing a poled piezoelectric film having opposite first and second surfaces; affixing a first printed circuit board (PCB) to the first surface of the poled piezoelectric film, where the first PCB includes opposite first and second surfaces, where the first PCB includes a plurality of rows of electrodes, and where each electrode of the plurality of rows of electrodes extends from the first surface to the second surface of the first PCB; and affixing a second PCB to the second surface of the poled piezoelectric film. The second PCB includes opposite first and second surfaces, where the second PCB includes a plurality of columns of electrodes, where each electrode of each column of electrodes of the second PCB extends from the first surface to the second surface of the second PCB, where each electrode of each row of electrodes of the first PCB is aligned with an electrode of a different one of the plurality of columns of electrodes of the second PCB, and where each respective pair of aligned electrodes is a respective individually-addressable sensor of the pressure sensor.

In one arrangement, electronic scanning of the individually-addressable sensors may be accomplished by capturing a row or rows of elements from a single system ultrasonic transmission followed by the capture of additional rows of elements (e.g., one or more per system transmission) and then assembling them into an image. For instance, the capture may be triggered by using an additional piezoelectric transducer with an acoustic offset (e.g., providing a time delay) or the rows may be scanned continuously using digital post detection of an acoustic pulse to select a capture window. In either case, the acoustic signal may be amplitude detected and processed with an appropriate transfer function to provide a meaningful real-time grey scale or color-coded image of the acoustic output intensity at the probe surface. Synchronization algorithms can be used to efficiently capture images of various ultrasonic system scanning modes improving the real-time rate of imaging the acoustic output.

The information collected by the systems disclosed herein enables a number of diagnostic determinations. In one embodiment, for example, the controller has instructions to determine a total power of the generated beam of acoustic energy from the electrical signals. In other embodiments, the controller has instructions to determine an acoustic dosimetry provided by the generated beam, to calculate a thermal index for the generated beam, and/or to calculate a mechanical index for the generated beam.

In some embodiments, the acoustic device may be moved relative to the imaging array. The acoustic-energy direction system may comprise an acoustic lens. Embodiments also enable the injection of an acoustic signal into the acoustic device, as well as determining various characters that include an acoustic dosimetry provided by the generated beam, a thermal index for the generated beam, and/or a mechanical index for the generated beam.

A further understanding of the nature and advantages of the present invention may be realized by reference to the remaining portions of the specification and the drawings, wherein like reference labels are used through the several drawings to refer to similar components. In some instances, reference labels are followed with a hyphenated sublabel; reference to only the primary portion of the label is intended to refer collectively to all reference labels that have the same primary label but different sublabels.

DETAILED DESCRIPTION

Figure 1:
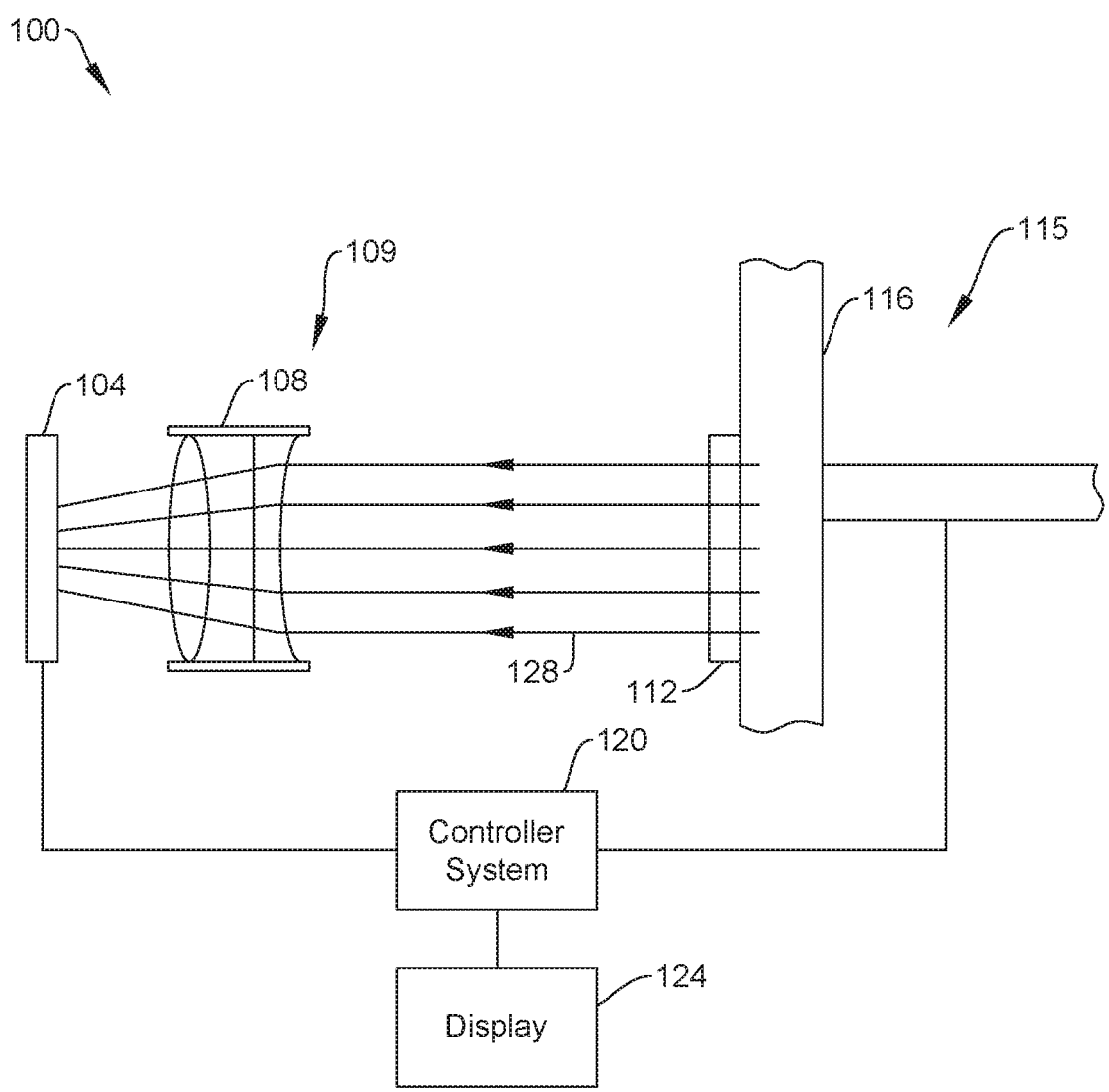
FIG. 1 is a schematic drawing of a system for testing acoustic systems or probes.

Embodiments of the invention provide methods, appliances, systems, and sensors for use in analyzing received pressure waves to obtain and deduce various types of meaningful information therefrom. While much of the below description is in the context of testing acoustic systems and/or probes (e.g., "acoustic devices") in discussing various aspects of the invention, such examples are intended merely for illustrative purposes; the invention is not intended to be limited by the particular type of pressure waves being analyzed and/or any operational characteristics used by the tested probe or system, such as the operational frequency of the tested acoustic device. As illustrated in further detail below, each of the acoustic probes and systems that may be tested with embodiments disclosed herein includes a plurality of "transducer elements," which refers to elements adapted to transmit acoustic radiation and/or to receive acoustic radiation. While such elements are referred to generically herein as "transducer elements," they may be distinguished at times according to their functions by describing them as "receiver elements" or "transmitter elements." Further, the present disclosure is not limited to use with array devices (e.g., larger, single-element probes may be evaluated by the technology of the present disclosure).

Embodiments disclosed herein are configured to sense and display a pressure wave distribution for use in analyzing received pressure waves in various manners. In the case of an acoustic device that generates a beam of acoustic waves, the sensed acoustic energy distribution over a contact surface of an acoustic device may be used to identify missing or defective transducer elements or regions in the acoustic device based on gaps or changes in the energy distribution in the image relative to other portions of the image. The disclosed embodiments further provide a calibrated measurement appliance capable of integrating the total acoustic output of the acoustic system and thereby determining the acoustic power. In some implementations, the disclosed systems may also be capable of injecting various acoustic signals back into the acoustic system via the probe aperture for detection and display. A two-dimensional image of the acoustically active aperture of the probe with the corresponding energy level provides a convenient operator interface that may be used in establishing an acoustic signature for a given probe type. In some instances, such an image may be color coded and may be presented with an integrated total power measurement. It will be appreciated by those of skill in the art that the resultant information may find utility in verifying various output parameters such as the mechanical index ("MI") and the thermal index ("TI").

The embodiments disclosed herein may be configured to have adequate resolution to detect missing elements from a variety of different probe configurations such as one-dimensional and two-dimensional matrix-array probes. Because two-dimensional matrix-array probes have nearly or even more than 10,000 elements, some implementations of the invention use a smaller pressure sensor that has adequate resolution but not large enough to cover the complete array. The combination of such a pressure sensor with position-sensing using any of a variety of techniques allows an operator to move the sensor over the surface of the probe being tested and thereby accumulate an imaging showing the acoustic energy distribution emanating from the probe. Examples of suitable sensor options include a mechanical linear-motion sensor attached to the probe or an optical position sensor.

In one example, the pressure sensor of the testing system may be configured as a line array along a shortest dimension of the acoustic device to be tested. With such a configuration, the acoustic device being tested may be swiped across the linear sensor with a resultant two-dimensional image assembled using the linear position sensor to track the motion of the probe to spatially register the detected acoustic information. In another example, the line array may be expanded from element wide to two, three or more elements wide. This may improve signal-to-noise values and provide for additional image registration. In a further example, a small two-dimensional sensor array is scanned over the surface of the probe with motion patterns such as a raster pattern to produce a complete two-dimensional image of the probe's acoustic output energy. This approach may further allow the use of the detected acoustic information to collect and to spatially register images to form an image covering the full aperture of the probe's surface. Merely by way of illustration, a 12×12 mm² sensor allows scanning of almost all current ultrasound probes with a single swipe, although differently sized sensors may be used with other existing or future probes.

A general overview of a testing system 100 disclosed herein is presented in FIG. 1. Many of the aspects of the testing system 100 may be the same as the testing system disclosed in U.S. Pat. No. 8,893,541 which is assigned to the assignee of the present application and which is incorporated herein by reference in its entirety as if set forth in full. As shown, a probe head 116 (e.g., including an array of acoustic transducers such as piezoelectric elements) of an acoustic device 115 is configured to generate or otherwise provide pressure waves such as acoustic radiation (acoustic energy) denoted generally by acoustic rays 128 that may be detected by a pressure sensor 104 (e.g., imaging array). As discussed herein, however, the system is also configured to detect and analyze various other types of pressure waves (i.e., not just acoustic energy). In one arrangement, the acoustic rays 128 may be directed to the sensor 104 using an acoustic-energy direction system 108 that may include elements configured for gross or precise direction and/or shaping of the acoustic rays 128 as appropriate for the application (e.g., such as acoustic lenses, acoustic mirrors, and the like). For instance, the acoustic-energy direction system 108 may receive unfocused acoustic rays 128 from the probe head 116 and direct the acoustic rays 128 to the sensor 104. The sensor 104 and acoustic-energy direction system 108 may be referred to as an acoustic camera 109. In one arrangement, the acoustic rays 128 may be propagated within a medium (not shown) suitable for the propagation of acoustic radiation (e.g., water or the like). In some embodiments, a couplant 112 may be provided to couple the acoustic rays 128 emitted by the probe head 116 to the medium.

The acoustic-energy direction system 108 may include any appropriate number of acoustic elements such as multiple acoustic-lens arrangements. Such systems may be configured according to known acoustic principles to provide dual-lens, triple-lens, and other arrangements. For example, the acoustic magnification provided by a lens is determined by the focal length f of the lens as related to the object distance $d_o$ and image distance $d_i$ by the lens equation:

$$\frac{1}{d_o} + \frac{1}{d_i} = \frac{1}{f}.$$

As the magnification M provided by a lens is the ratio of object to image distance, i.e. $M \equiv d_o/d_i$, variations in focal length result in variations in the magnification. A zoom lens arrangement provides certain advantageous characteristics and may be implemented in a variety of different ways. For example, a three-lens system having a first positive lens, a second negative lens, and a third positive lens may be used to implement a zoom system. In a particular embodiment, the first and second lenses have equal (but opposite) power so that with their focal lengths being denoted respectively as $f_1$ and $f_2$, the range of effective focal length $f^{(eff)}$ is given by $$\frac{f_1 f_2}{f_1 + f_2} \le f^{(eff)} \le \frac{2 f_1 f_2}{f_1 + 2 f_2}.$$

Maximal effective focal length is achieved with a substantially zero separation between the two lenses, decreasing with separation until the separation approaches $f_1$. The third lens in the arrangement uses the virtual image formed by the first two lenses as an object, collimating the diverging rays to form an image on the sensor 104. Axial movement of the central negative lens thus varies the power of the system, providing a zoom arrangement. Methods known in the art may be used to vary the position of the central negative lens, and it will be understood that a variety of other lens configurations may be used in providing zoom functionality.

The imaging system 100 may also include a controller system or controller 120 for coordinating operation of the acoustic device 115 being tested with the sensor (e.g., to provide triggering functions described in greater detail below), generating and displaying images on a display 124 based on acoustic signals received at the sensor 104, and the like.

Figure 2:
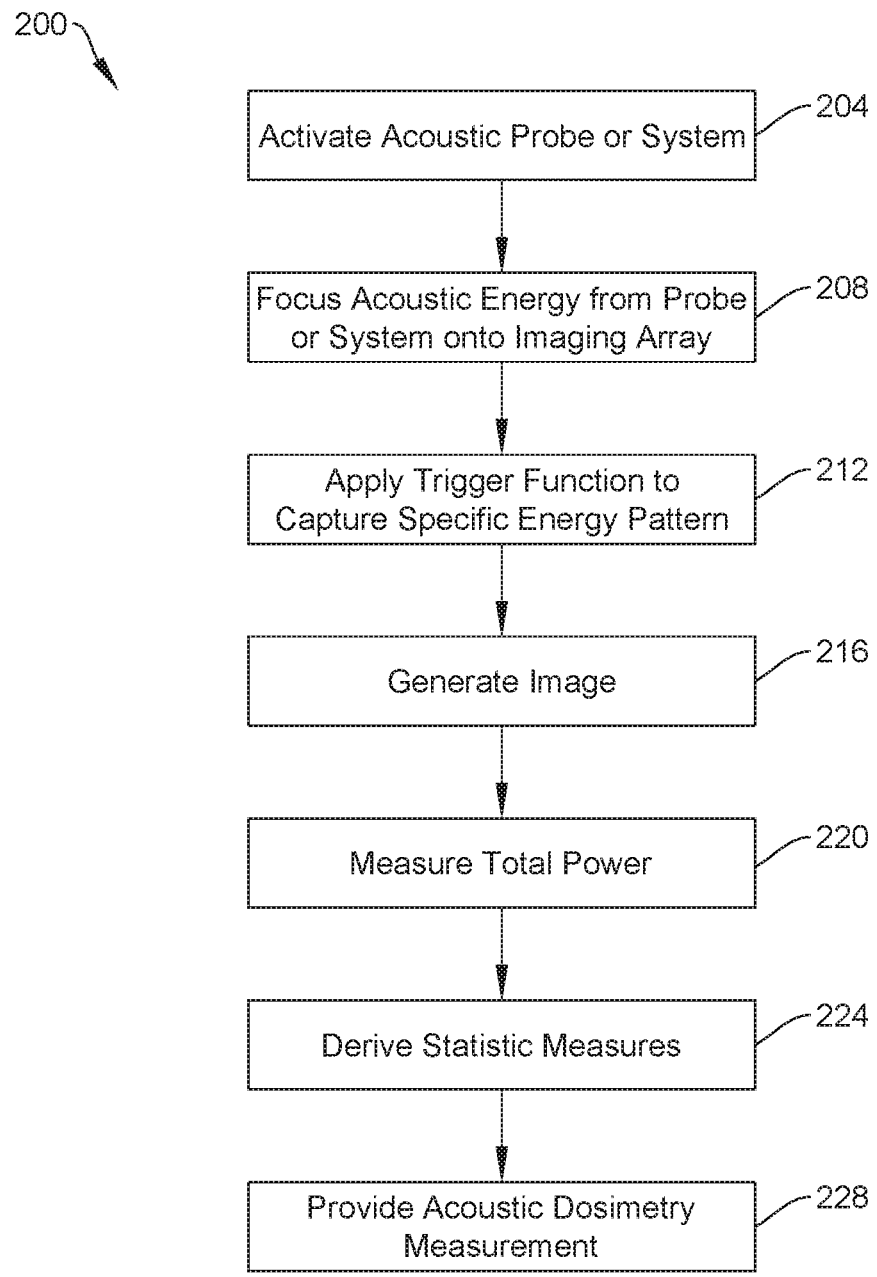
FIG. 2 is a flow diagram of a method for testing acoustic systems or probes.

FIG. 2 presents a flow diagram of a method 200 for analyzing pressure waves (e.g., for use in testing acoustic devices) in accordance with embodiments of the invention and that may utilize an system 100 like that illustrated in FIG. 1. It is to be understood that more, fewer, or different steps may be included in the method 200 without departing from the spirit and scope of the present disclosure. At 204, the acoustic device 115 (e.g., the acoustic probe 116) is activated to generate a beam of acoustic rays 128. The generated acoustic rays 128 may be focused 208 (e.g., via acoustic-energy direction system 108) onto the imaging array or pressure sensor 104. In one arrangement, a triggering function may be applied 212 to capture a specific energy pattern from the received acoustic rays 128. Acoustic imaging systems generally use complex scanning patterns so that evaluation of its operation can be improved by consistent selection of a portion of the scanning pattern. In one embodiment, the largest pulse for a given probe may be selected by capturing the peak pulse from successive image frames to limit the mixing of transducer pulses that may be pointed in various directions and improve the calibration of quantities such as total power output, MI, TI, and the like. For instance, triggering may be implemented with the controller 120 by causing the pressure sensor 104 to capture an image at appropriate times in accordance with the selection.

Accordingly, an image may be generated 216 (e.g., by way of one or more sets of computer readable instructions executed by the controller 120) for display on the display 124 whereby defects in individual transducer elements may be readily detected by gaps in the generated image. In one arrangement, total power may be measured 220 and included as part of the generated image to provide a ready and convenient basis for the calibration of individual probes and systems. In addition to determining the total power from the acoustic radiation received at the imaging array 104, certain statistical measures may be derived 224. For example, the MI is defined as the quotient of the peak negative pressure P_ and the square root of frequency $f_0$:

$$MI = \frac{P_-}{\sqrt{f_0}}.$$

The MI provides an indicator of possible nonthermal bioeffects from acoustic insonification of biological tissue, such as may result from cavitation and/or streaming. While existing acoustic systems generally display values for the MI, it is known that the accuracy is highly variant; the value displayed by the system may differ from the actual value by 50% or more. The ability for accurate determination of the MI thus provides a valuable source of information. Even in nonmedical contexts, the value of the MI may be relevant in defining human-safety protocols in use of acoustic probes.

The TI is defined as the ratio of the power used to the power required to produce a temperature rise of 1° C. It thus provides a measure of thermal effects on biological tissue resulting from insonification. Three sub-indices provide specific measures in soft tissue ("TIS"), in bone ("TIB"), and in the cranium ("TIC"). Again, such measures are known to be determined with highly variable accuracy by the acoustic systems themselves so that an ability for direct determination of their values allows more reliable decisions to be made about the use of specific, individual probes in both medical and nonmedical contexts.

The general purpose of the TI is to translate the relative acoustic output power of an acoustic device into a quantity that correlates with models for tissue heating due to acoustic exposure. As the output power of an acoustic system or probe increases, so does the TI. The temperature rise in vivo is also significantly influenced by how the acoustic energy propagates through the tissue. Using highly focused model of operation with stationary acoustic beams such as "spectral Doppler" (e.g., pulsed wave and continuous wave) and TM-mode focus the acoustic energy into a smaller area (i.e., high time average acoustic intensity) and in the case of continuous-wave Doppler, results in higher localized temperature increases. In non-scanning modes, the location of the maximum temperature rise varies as a function of the size of the active aperture of the probe. For example, with a smaller aperture, the tissue closer to the energy source is the area of highest temperature rise.

Conversely, scanning modes of operation such as B-mode imaging disperse the acoustic power over a wider area, known as the field of view, resulting is less-localized tissue heating at increased depths. In vivo acoustic intensity also decreases as a function of depth because of attenuation of acoustic energy (i.e., tissue attenuation coefficient). In addition to acoustic intensity, the resulting temperature rise also depends on the rate at which the energy is converted into heat in the tissue (i.e., tissue absorption coefficient), the diffusion of the heat in the tissue (i.e., thermal conductivity), and the rate at which the heat is removed by blood flow in the tissue (i.e., blood perfusion). The tissue location that receives the maximum acoustic exposure for the longest time, i.e. acoustic dose, is the point of probe contact at the tissue contact surface.

It is widely held that the TI gives a relative indication of the potential for temperature increase at a specific point along the acoustic beam and therefore that the TI provides a relative indication of exposure conditions that are more likely than others to produce thermal effects. But the duration of exposure is known to be a critical factor in determining the likelihood of inducing a thermal effect, with the risk of thermal damage increasing exponentially with exposure time. The values of TI displayed on current ultrasound system monitors do not include any dependence on exposure time. As a result, a longer exposure at a lower TI might be more of a risk to a patient than a shorter exposure at a higher TI. Since the system-displayed values do not inform the operator of risk based on exposure duration, the TI value is, at best, a weak indication of potential patient harm from excessive thermal load.

The dimensionless TI and MI values displayed on contemporary ultrasound system monitors are not measures of the actual energy present at the aperture of a specific probe on a specific system; they are rather a statistical composite of a population of in-kind probes on in-kind systems and may not provide an adequate measure of exposure risk in newer modalities. Embodiments of the invention are better able to respond to the growing complexity of systems, probes, modalities, clinical applications, and concerns about patient safety by directly visualizing and measuring the energy present at the probe aperture (tissue contact surface) and providing 228 an acoustic dosimetry measurement.

As discussed previously herein, some existing pressure sensors are limited in that they often require sealed fluid reservoirs in combination with acoustic lenses to accommodate larger ranges of ultrasound probes, are relatively expensive, and the like. In this regard, and turning now to FIG. 3, a pressure sensor 304 (e.g., which may be used in place of the pressure sensor 104 of FIG. 1) disclosed herein is illustrated that limits the need for adapters or reverse engineering (e.g., by operating independently of the design of acoustic probes under test), leverages excellent economy of scale, and can be constructed with reduced cost. The disclosed pressure sensor 304 allows for the generation of dynamic, two dimensional images representing the received pressure waves (e.g., acoustic output) in a plane perpendicular to the incoming waves (e.g., perpendicular to the face of the acoustic device, such as close to the patient interface and radiating surface).

Broadly, the pressure sensor 304 includes a piezoelectric layer 308 having opposite first and second surfaces 312, 316 and a plurality of electrodes 344 disposed over at least one of the first and second surfaces 312, 316 that are configured to receive electrical signals generated by the piezoelectric layer 308 in response to vibrations from received acoustic rays (e.g., acoustic rays 128) for transmission to a controller (e.g., controller 124). As an example, the electrodes 344 may be in the form of first and second grids of electrodes 344, 348 that are disposed on or within first and second PCBs 320, 332 (e.g., rigid PCBs or flexible PCBs) that are respectively disposed over (e.g., secured to) the first and second opposite surfaces 320, 328 of the piezoelectric layer 308 in any appropriate manner.

For instance, the electrodes 344 of the first PCB 320 may be in the form of a plurality of rows 352 of electrodes 344 (e.g., where the electrodes 344 in each respective row 352 are electrically connected in series by traces 353) and the electrodes 348 of the second PCB 332 may be in the form of a plurality of columns 356 of electrodes 346 (e.g., where the electrodes 348 in each respective column 356 are electrically connected in series by traces 357). In one arrangement, each of the electrodes 344, 348 may be in form of an aperture or via (e.g., plated or filled with an electrically conductive material) that extends from a first surface 324, 336 to an opposite second surface 328, 340 of the first and second PCBs 320, 332. While only three rows 352 and columns 356 of electrodes 344, 348 have been illustrated, the pressure sensor 304 may in incorporate many more than three rows 352 and columns 356.

Each electrode 344, 348 may be respectively surrounded by a ground layer to isolate the electrodes 344, 348 from the piezoelectric layer 308 and thereby make each respective sensor unique as to the other sensors. For instance, the ground lawyer may be poured around the electrodes, so as to surround the electrodes in-plane to ensure that the piezoelectric layer 308 is not sandwiched between electrodes and shorted (via poured grounds top and bottom), which may otherwise limit the effective size of the sensor.

As can be seen, the plurality of rows 352 of electrodes 344 of the first PCB 320 may be aligned with the plurality of columns 356 of electrodes 348 of the second PCB 332 such that each electrode 344 of the first PCB 320 is aligned with a particular respective electrode 348 of the second PCB 332. Stated differently, each electrode 344 of each row 352 of electrodes of the first PCB 320 is aligned with an electrode 348 of a different one of the plurality of columns 356 of electrodes of the second PCB 332. As used herein, an electrode 344 being "aligned" with a respective electrode 348 means that the electrodes 344, 348 substantially overlap about an axis 346 that extends through the first and second surfaces 324/336, 328/340 of the first and second PCBs 320, 332 and that is perpendicular to the first and second surfaces 324/336, 328/340 of the first and second PCBs 320, 332 (e.g., at least 50% overlap, such as at least 80% overlap). Accordingly, each pair of electrodes 344, 348 forms a different respective individually-addressable sensor of the sensor 304. This arrangement advantageously allows for individual sensors to be addressed in a matrix fashion to reduce the number of layers required to route signals out of the sensor grid to the receive electronics.

Figure 3:
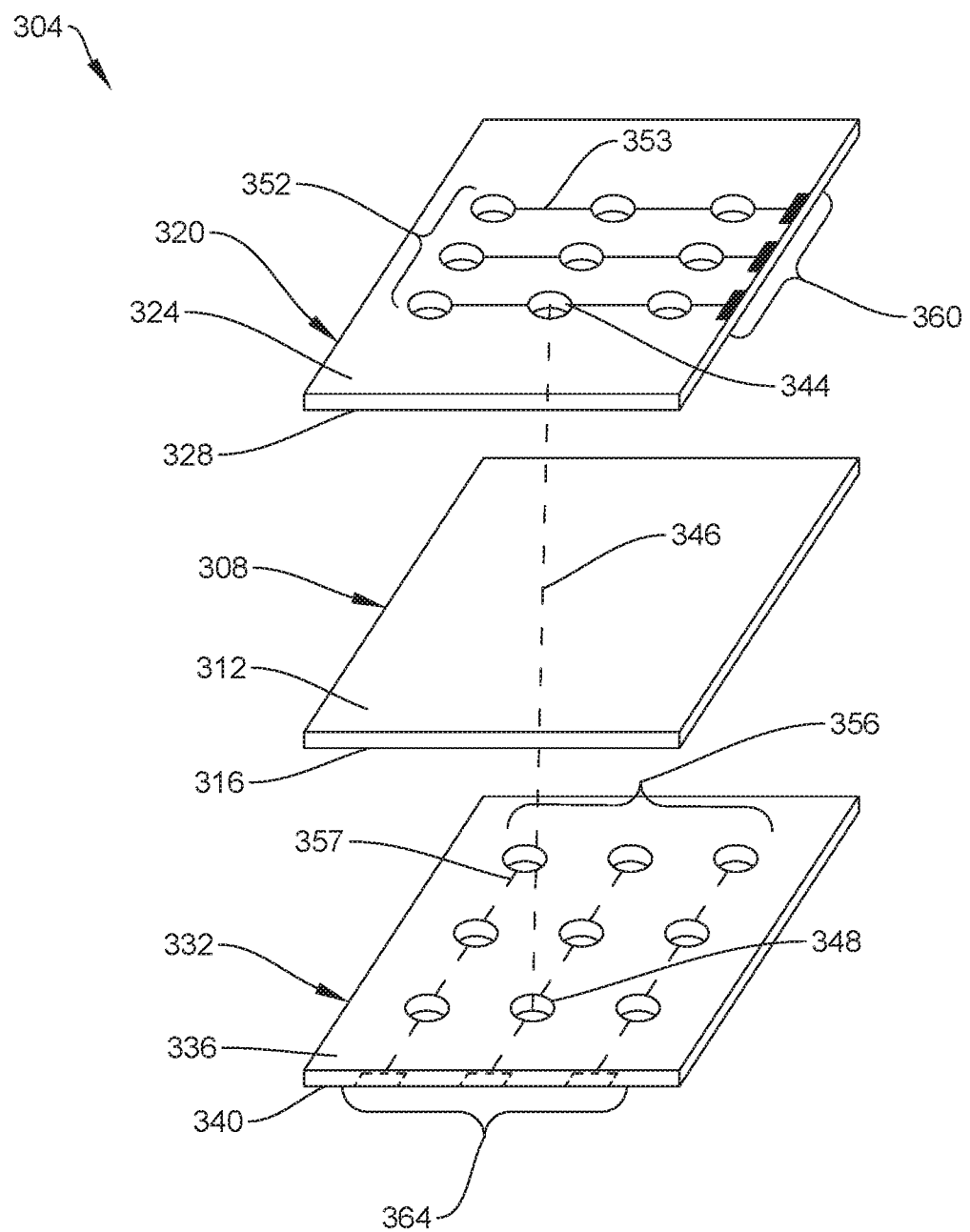
FIG. 3 is an exploded perspective view of a sensor for use with the system of FIG. 1.
Figure 4:
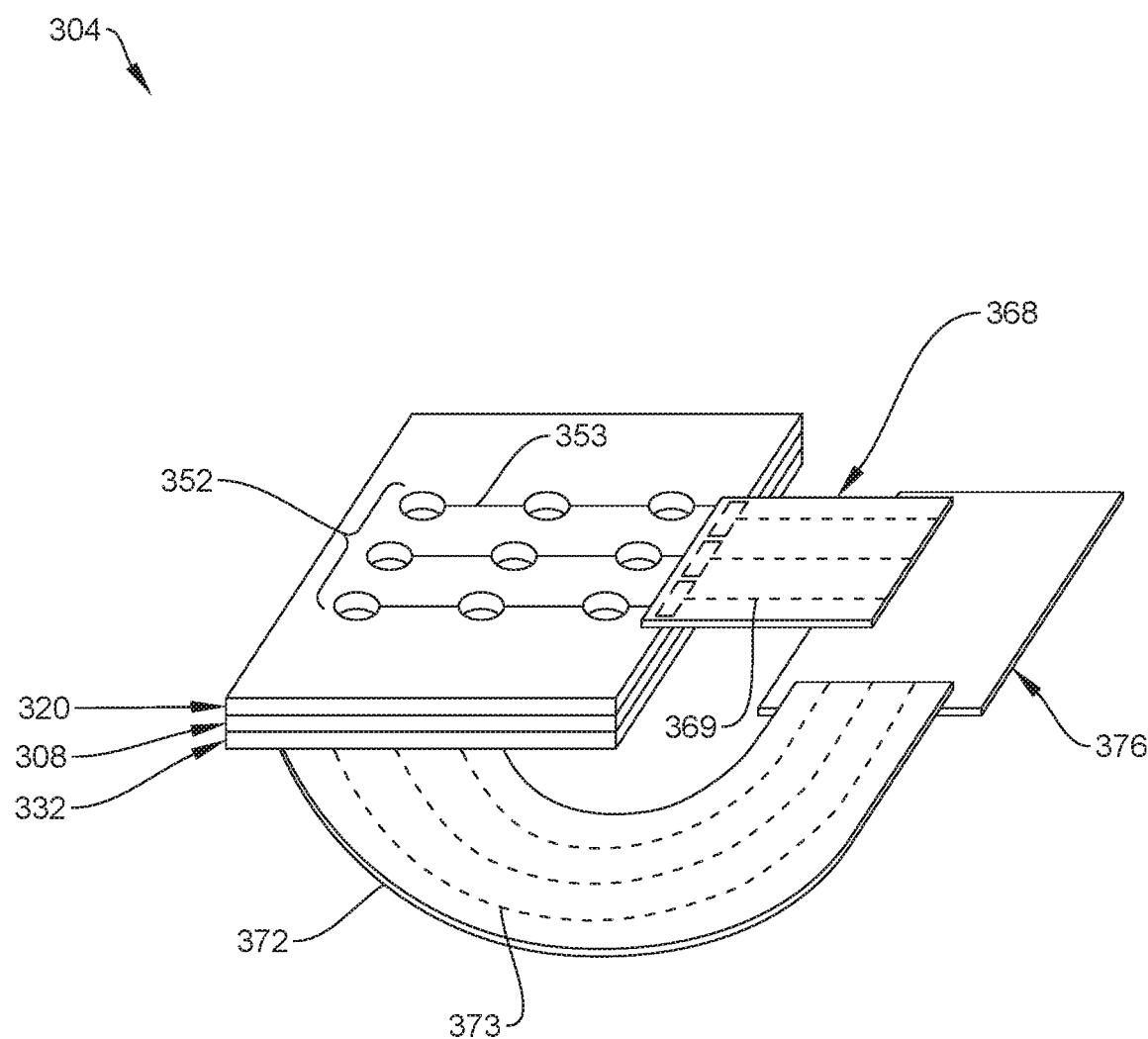
FIG. 4 is an assembled perspective view illustrating the sensor of FIG. 3 being electrically connected to a connector.
Figure 5:
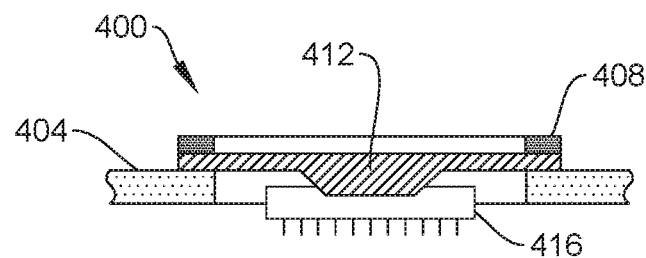
FIG. 5 illustrates a structure of an array interface for coupling acoustic energy onto an imaging array.

Furthermore, each respective row 352 and column 356 of electrodes 344, 348 may include respective electrical leads or pads 360, 364 that are configured to facilitate electrical interconnection of the rows 352 and columns 356 of electrodes 344, 348 to controller 120. With reference now to FIGS. 3-4, first and second connectors 368, 372 (e.g., flexible printed circuits (FPC) or flex circuits including respective sets of traces 369, 373) may be used to electrically connect the plurality of pads 360, 364 to a connector board 376 (e.g., PCB) that may form part of or otherwise be in communication with the controller 120. This arrangement advantageously allows for accurate isolation of acoustic parameters from specific portions of the acoustic rays by way of analyzing electrical signals received from specific ones of the individual sensors (pairs of aligned electrodes 344, 348) of the pressure sensor 304 (e.g., where reading electrical signals from a particular row 352 and particular column 356 would correspond to a particular individual sensor made up by a particular electrode 344 from the row 352 and a particular aligned electrode 348 from the column 356).

The piezoelectric layer 308 may in one embodiment be in the form of a PVDF film of any appropriate thickness (e.g., 25 μm) that is configured to generate an electrical charge upon application of a mechanical stress (e.g., vibrations) induced by received acoustic rays 128 (or other types of pressure waves). In one arrangement, the piezoelectric layer 308 may be substantially uniformly poled (e.g., with positively and negatively charged particles respectively accumulating near the first and second surfaces 312, 316 thereof) prior to application of the electrodes 344, 348 (e.g., the first and second PCBs 320, 332) over such first and second surfaces 312, 316. As used herein, "substantially uniformly poled" means being poled in the thickness direction across a length and width of the piezoelectric layer 308.

In one arrangement, the various traces 353, 357, 369, 373 may be electrically isolated from the piezoelectric layer 308 by way of a layer of material (not shown) having a relatively high dielectric constant (e.g., produced by optimizing dielectric material and thickness). To reduce the need for additional tissue equivalent materials that absorb acoustic energy, the first and second PCBs 320, 332 may be in the nature of flexible PCBs that have acoustic impedances closer to that of water. In other embodiments, the first and second PCBs 320, 332 could be in the nature of "FR4" material.

While the arrangement of electrodes 344, 348 in the pressure sensor 304 of FIG. 3 has been illustrated in the nature of a generally rectilinear arrangement of rows 352 and columns 356 (e.g., where the rows 352 are generally perpendicular to the columns 356), various other more complicated arrangements affording increasing degrees of resolution are also envisioned and encompassed herein (e.g., honeycomb patterns, etc.). In one arrangement, a specified one of the electrodes 344, 348 may be read out while the immediately adjacent electrodes 344, 348 is tied to ground to better isolate the specified electrode 344, 348.

As discussed previously, the controller 120 may be generally configured to coordinate operation of the acoustic device 115 being tested with the sensor and generate and display images on a display 124 based on acoustic signals received at the sensor 104 (e.g., sensor 304). For instance, the piezoelectric layer 308 of the sensor 304 may be configured to receive pressure waves (e.g., a beam of acoustic energy such as acoustic rays 128 generated by an acoustic device (e.g., acoustic probe 116)), deform in response to the received pressure waves, and generate electrical signals (e.g., electrical charge) based on the deformation response. The generated electrical signals may then be received by the electrodes 344, 348 and travel through the various traces and connectors for receipt by the controller 120 whereupon the controller 120 is configured to analyze the signals to generate images and other analytics as discussed herein.

Electronic scanning of the sensor 304 may be accomplished by the controller 120 by capturing a row/column or rows/columns of electrodes 344, 348 from a single system ultrasonic transmission followed by the capture of additional rows/columns of elements (one or more per system transmission) and then assembling them into an image. For instance, the capture may be triggered via the use of an additional piezoelectric transducer with an acoustic offset providing a time delay. As another example, the rows/columns may be scanned continuously using digital post detection of an acoustic pulse to select a capture window. In either case, the acoustic signal may be amplitude detected and processed with an appropriate transfer function to provide a meaningful "real time" grey scale or color-coded image of the acoustic output intensity at the probe surface. Synchronization algorithms can be used to efficiently capture images of various ultrasonic system scanning modes to improve the real-time rate of imaging the acoustic output.

The acoustic beam focused by the acoustic-energy direction system 108 may sometimes be coupled onto the pressure sensor (e.g., pressure sensor 304) through an array interface 400 like that shown in FIG. 4 to limit any acoustically transmissive medium within a housing of the acoustic camera 109 from contacting the pressure sensor. The pressure sensor is denoted generically by reference number 416 in FIG. 4 and corresponds to pressure sensor 104, 304, FIGS. 1 and 3. The array interface 400 includes a diaphragm 412 having a truncated conical segment and a retainer ring 408. The diaphragm 412 is sealed to a backplate 404 using the retainer ring 408. The diaphragm 412 comprises an acoustically transmissive material such as polyurethane, allowing the coupling of acoustic energy from the acoustically transmissive medium onto the pressure sensor 416 while preventing the acoustically transmissive medium from contacting the pressure sensor 416.

Advantageously, embodiments of the invention are not limited by the particular structure of the acoustic device 115, are not limited by the frequency characteristics of the acoustic probe or system being tested, and do not necessarily require the use of adapters to accommodate different transducer arrangements used by different probes 116.

To fabricate or manufacture the disclosed pressure sensor 304, a substantially fully poled piezoelectric film (e.g., piezoelectric layer 308) of any appropriate dimensions may initially be provided. Thereafter, first and second PCBs (e.g., first and second PCBs 320, 332) including respective grids of electrodes (e.g., including respective rows 352 and columns 356 of electrodes 344, 348) may be respectively affixed over first and second opposite surfaces of the piezoelectric layer such as by a thin layer of epoxy. Once affixed, each electrode of each row of electrodes of the first PCB is aligned with an electrode of a different one of the plurality of columns of electrodes of the second PCB such that each respective pair of aligned electrodes is a respective individual sensor of the pressure sensor.

Figure 6:
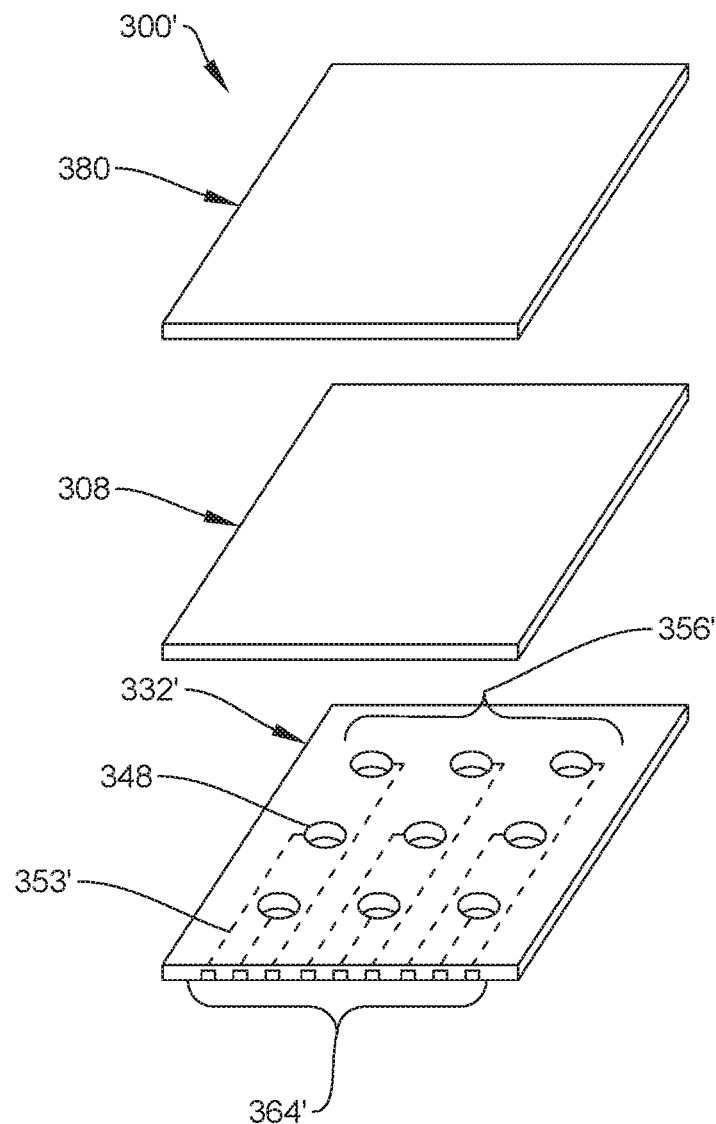
FIG. 6 is an exploded perspective view of a sensor for use with the system of FIG. 1, according to another embodiment.

FIG. 6 presents an exploded perspective view of another embodiment of the sensor 304'. In this embodiment, each electrode 348 of each row 352' of the PCB 332 is directly connected to a different respective electrical pad 364' via a different respective electrical trace 353'. Also in this embodiment, the PCB 320 has been replaced by a ground layer 380 (e.g., poured or sputtered ground layer). Each respective electrode 348 and the ground layer 380 thus functions as a different respective individual sensor of the pressure sensor 304'. Furthermore, connectors (e.g., connector 368, 372) may electrically connect the pressure sensor 304' to the controller 120. Accordingly, the controller 120 may receive electrical signals from the pressure sensor 304 in response to receive acoustic energy and generate corresponding images and analytics as discussed herein.

It is to be understood that the various pressure sensors disclosed herein are not limited to receipt and analysis of acoustic energy for use in testing ultrasound probes in a medical context and more broadly may be used (e.g., in conjunction with the controller 120 and display 124) to detect and analyze pressure waves in numerous other contexts. In one arrangement, the disclosed system may be used as a hydrophone to facilitate accelerated tank measurements and the like.

It will be readily appreciated that many deviations may be made from the specific embodiments disclosed in the specification without departing from the spirit and scope of the invention. The illustrations and discussion herein has only been provided to assist the reader in understanding the various aspects of the present disclosure. Furthermore, one or more various combinations of the above discussed arrangements and embodiments are also envisioned.

Embodiments disclosed herein can be implemented as one or more computer program products, i.e., one or more modules of computer program instructions encoded on a computer-readable medium for execution by, or to control the operation of, data processing apparatus (processors, cores, etc.). The computer-readable medium can be a machine-readable storage device, a machine-readable storage substrate, a memory device, a composition of matter affecting a machine-readable propagated signal, or a combination of one or more of them. In addition to hardware, code that creates an execution environment for the computer program in question may be provided, e.g., code that constitutes processor firmware, a protocol stack, a database management system, an operating system, or a combination of one or more of them.

A computer program (also known as a program, software, software application, script, or code) used to provide the functionality described herein can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

While this disclosure contains many specifics, these should not be construed as limitations on the scope of the disclosure or of what may be claimed, but rather as descriptions of features specific to particular embodiments of the disclosure. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A system for analyzing pressure waves, the system comprising:
    a pressure sensor for generating electrical signals in response to impinging receipt of pressure waves including:
        a first printed circuit board (PCB) that includes a plurality of rows of electrodes surrounded by ground for isolation;
        a second PCB that includes a plurality of columns of electrodes surrounded by ground for isolation;
        a piezoelectric layer disposed between the first and second PCBs and in conductive contact with the electrodes of the first and second PCBs, wherein each electrode of each row of electrodes of the first PCB is aligned with an electrode of a different one of the plurality of columns of electrodes of the second PCB, and wherein each respective pair of aligned electrodes is a respective individually-addressable sensor; and
    a controller electrically coupled with the individually-addressable sensors of the pressure sensor and having instructions to generate an image on a display based on the generated electrical signals received from the pressure sensor.

2. The system of claim 1, wherein the first PCB includes opposite first and second surfaces, wherein the second PCB includes opposite first and second surfaces, wherein each electrode of the plurality of rows of electrodes extends from the first surface to the second surface of the first PCB, and wherein each electrode of the plurality of columns of electrodes extends from the first surface to the second surface of the second PCB.

3. The system of claim 2, wherein each electrode of the plurality of rows and columns of electrodes is a plated via.

4. The system of claim 2, wherein each electrode of the plurality of rows and columns of electrodes is a filled via.

5. The system of claim 1, wherein the first PCB includes a plurality of electrically conductive pads that are respectively electrically connected to the plurality of rows of electrodes, wherein the second PCB includes a plurality of electrically conductive pads that are respectively electrically connected to the plurality of columns of electrodes, and wherein the controller is electrically interconnected to the pads of the first and second PCBs.

6. The system of claim 5, further including:
    a first flexible printed circuit (FPC) connector connected between the pads of the first PCB and the controller; and
    a second FPC connector connected between the pads of the second PCB and the controller.

7. The system of claim 6, wherein the first and second FPCs are electrically connected to a PCB of the controller.

8. The system of claim 1, wherein the piezoelectric layer is a polyvinylidene fluoride (PVDF) layer.

9. The system of claim 1, wherein each of the first and second PCBs is a flexible PCB.

10. The system of claim 1, further including:
    a direction system disposed to focus the pressure waves onto the pressure sensor.

11. The system of claim 10, wherein the pressure sensor and the direction system are disposed within a housing body.

12. The system of claim 1, wherein:
    the pressure waves are beams of acoustic energy generated in a scanning pattern;
    the controller comprises instructions to capture a subset of the beams of energy defined by the scanning pattern; and
    the image provides a representation of the captured subset of the beams of energy defined by the scanning pattern.

13. The system of claim 12, wherein the subset of the beams comprises a peak pulse of the scanning pattern.

14. A method for analyzing pressure waves, the method comprising:
    receiving, at a piezoelectric layer of a pressure sensor, a beam of pressure waves;
    deforming the piezoelectric layer with the received beam of pressure waves;
    generating, by the pressure sensor, electrical signals between opposing aligned pairs electrodes of a first printed circuit board (PCB) and a second PCB, the first PCB including a plurality of rows of electrodes surrounded by ground for isolation and the second PCB including a plurality of columns of electrodes surrounded by ground for isolation, the electrodes of both the first PCB and the second PCB in conductive contact with the piezoelectric layer disposed between the first PCB and the second PCB in response to the deforming, wherein each pair of aligned electrodes is an individually-addressable sensor;
    sending the generated electrical signals to a controller; and
    generating, by the controller, an image on a display from the generated electrical signals, the image providing a representation of the received beam of pressure waves.

15. The method of claim 14, wherein the sending includes sending a plurality of sets of generated electrical signals to the controller, wherein each set includes generated electrical signals from a different respective row of the electrodes in the first PCB, and wherein the generating includes:
    assembling the plurality of sets of generated electrical signals into the image.

16. The method of claim 14, wherein the beam of pressure waves is a beam of acoustic energy generated by an acoustic device, and wherein the generating includes:
    processing the generated electrical signals to provide an indication of an acoustic output intensity at the acoustic device.

* * * * *